United States Patent
Medina Silva et al.

(10) Patent No.: US 12,480,205 B2
(45) Date of Patent: Nov. 25, 2025

(54) METHOD OF GROWING MONOLAYER TRANSITION METAL DICHALCOGENIDES VIA SULFURIZATION AND SUBSEQUENT SUBLIMATION

(71) Applicant: Agency for Science, Technology and Research, Singapore (SG)

(72) Inventors: Henry Medina Silva, Singapore (SG); Dongzhi Chi, Singapore (SG); Shi Wun Tong, Singapore (SG); Jianwei Chai, Singapore (SG); Shijie Wang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 327 days.

(21) Appl. No.: 18/012,412

(22) PCT Filed: Jun. 28, 2021

(86) PCT No.: PCT/SG2021/050374
§ 371 (c)(1),
(2) Date: Dec. 22, 2022

(87) PCT Pub. No.: WO2022/005398
PCT Pub. Date: Jan. 6, 2022

(65) Prior Publication Data
US 2023/0243030 A1    Aug. 3, 2023

(30) Foreign Application Priority Data
Jun. 30, 2020   (SG) .......................... 10202006330T

(51) Int. Cl.
C23C 16/02     (2006.01)
C23C 14/08     (2006.01)
(Continued)

(52) U.S. Cl.
CPC ........ *C23C 16/0281* (2013.01); *C23C 14/083* (2013.01); *C23C 14/185* (2013.01);
(Continued)

(58) Field of Classification Search
CPC . C23C 16/0281; C23C 14/083; C23C 14/185; C23C 14/5866; C23C 16/305;
(Continued)

(56) References Cited

U.S. PATENT DOCUMENTS

2018/0226248 A1*  8/2018  Jahangir .......... H01L 21/02488
2018/0269059 A1   9/2018  Lin et al.

FOREIGN PATENT DOCUMENTS

KR    20180002925 A    1/2018

OTHER PUBLICATIONS

International Search Report for International Application No. PCT/SG2021/050374 dated Sep. 20, 2021, pp. 1-4.
(Continued)

*Primary Examiner* — Julia Slutsker
(74) *Attorney, Agent, or Firm* — Shackelford, McKinley & Norton, LLP

(57) ABSTRACT

A method for forming a transition metal dichalcogenide monolayer, which includes depositing a transition metal, a transition metal oxide, or a mixture thereof, on a substrate, introducing a chalcogen precursor to the transition metal, the transition metal oxide, or the mixture thereof, in the presence of an etching gas and a carrier gas at a first temperature, to form a transition metal dichalcogenide on the substrate from the transition metal, the transition metal oxide, or the mixture thereof, and subliming the transition metal dichalcogenide on the substrate in the presence of a pulsating supply of a vapor of the chalcogen precursor to form the transition metal dichalcogenide monolayer at a second tem-
(Continued)

perature, wherein the vapor of the chalcogen precursor comprises a chalcogen vapor.

18 Claims, 9 Drawing Sheets

(51) Int. Cl.

| | |
|---|---|
| *C23C 14/18* | (2006.01) |
| *C23C 14/58* | (2006.01) |
| *C23C 16/30* | (2006.01) |
| *C23C 16/448* | (2006.01) |
| *C23C 16/455* | (2006.01) |
| *C23C 16/46* | (2006.01) |
| *C23C 28/00* | (2006.01) |
| *H01L 21/02* | (2006.01) |

(52) U.S. Cl.
CPC ........ *C23C 14/5866* (2013.01); *C23C 16/305* (2013.01); *C23C 16/4482* (2013.01); *C23C 16/45523* (2013.01); *C23C 16/46* (2013.01); *C23C 28/322* (2013.01); *C23C 28/3455* (2013.01); *H01L 21/0242* (2013.01); *H01L 21/02568* (2013.01); *H01L 21/02614* (2013.01)

(58) Field of Classification Search
CPC .......... C23C 16/4482; C23C 16/45523; C23C 16/46; C23C 28/322; C23C 28/3455; C23C 14/5806; C23C 16/0272; H01L 21/0242; H01L 21/02568; H01L 21/02614; H01L 21/02422; H01L 21/02664; H01L 21/02612; H01L 21/0259
See application file for complete search history.

(56) References Cited

OTHER PUBLICATIONS

Written Opinion of the International Searching Authority for International Application No. PCT/SG2021/050374 dated Sep. 20, 2021, pp. 1-5.

Kalanyan et al., "Rapid Wafer-Scale Growth of Polycrystalline 2H—MoS2 by Pulsed Metalorganic Chemical Vapor Deposition," Chemistry of Materials, vol. 29, No. 15, 2017, pp. 6279-6288.

Rong et al., "Controlling Sulphur Precursor Addition for Large Single Crystal Domains of WS2," Nanoscale, vol. 6, No. 20, 2014, pp. 12096-12103.

Wu et al., "The Growth Mechanism of Transition Metal Dichalcogenides by Using Sulfurization of Pre-Deposited Transition Metals and the 2D Crystal Hetero-Structure Establishment," Scientific Reports, vol. 7, No. 1, 2017, pp. 1-8.

Nipane et al., "Atomic Layer Etching (ALE) of WSe2 Yielding High Mobility p-FETs," 2019 Device Research Conference, Mar. 26, 2020, pp. 231-232.

Wang et al., "Layer Thinning of MoS2 Flakes by Thermal Annealing in Air," 2017 IEEE 12th International Conference on ASIC, Jan. 11, 2018, pp. 580-583.

\* cited by examiner

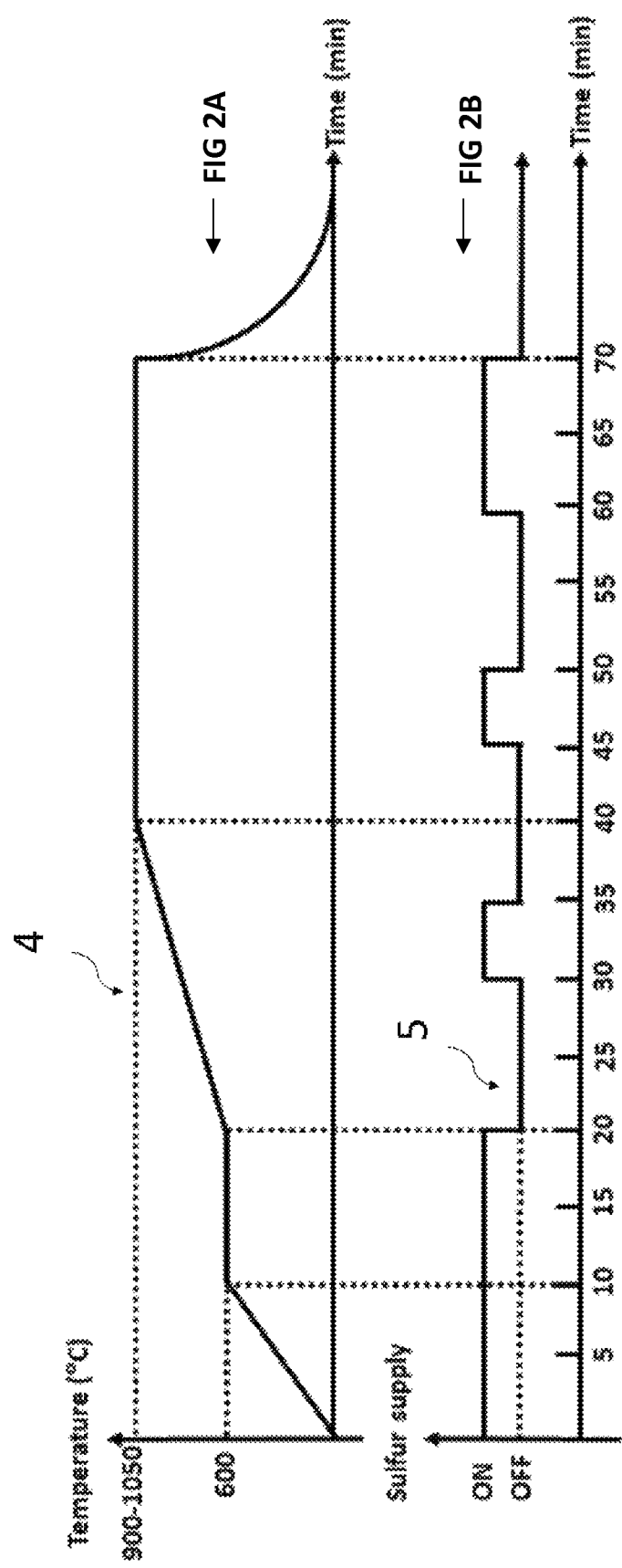

FIG. 6A
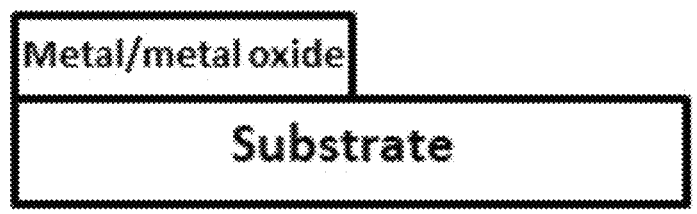
Side view
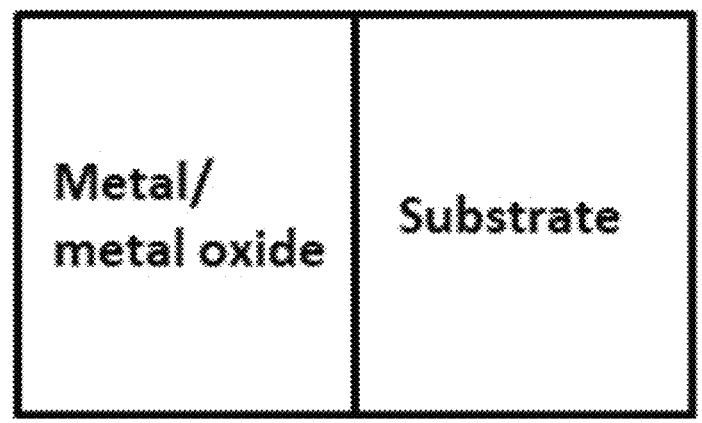
Top view
FIG. 6B
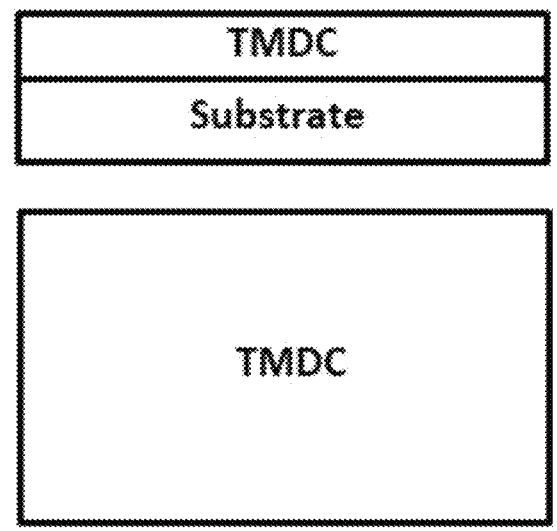

METHOD OF GROWING MONOLAYER TRANSITION METAL DICHALCOGENIDES VIA SULFURIZATION AND SUBSEQUENT SUBLIMATION

CROSS-REFERENCE TO RELATED APPLICATION

This application claims the benefit of priority of Singapore patent application No. 10202006330T, filed 30 Jun. 2020, the content of it being hereby incorporated by reference in its entirety for all purposes.

TECHNICAL FIELD

The present disclosure relates to a method of forming a transition metal dichalcogenide monolayer.

BACKGROUND

There has been intensive efforts in searching for alternative channel materials for future ultra-scaled electronic devices as the feature size of silicon-based transistors has been scaled down to a point of their physical limit.

Atomically thin transitional metal dichalcogenides (TMDCs), such as $WS_2$, $MoS_2$, $WSe_2$, $MoSe_2$, may be able to exhibit unique properties compared to their bulk crystals form. The properties include indirect-to-direct bandgap transitions, strong spin-orbit coupling and valley polarization. In particular, monolayer $WS_2$ tends to show the highest theoretical room temperature electron mobility among other semiconducting TMDCs as a result of its low effective mass. Combined with the large exciton/trion binding energy with high photoluminescence quantum yield, monolayer $WS_2$ appears to be a potential candidate as a channel material for use in optoelectronic applications.

Among various processes for the growth of TMDCs, the sulfurization in a chemical vapor deposition (CVD) furnace using sulfur powder as solid-phase precursor may have been widely applied to demonstrate large-area growth of continuous TMDC thin films. However, it remains challenging to grow wafer-sized, highly uniform and strictly monolayer TMDCs continuous film using such method due to the uncontrollable growth kinetics. In a traditional sulfurization process, the substrate may be first deposited with a metal or metal oxide uniformly and then placed at a high-temperature zone of a CVD furnace. Subsequently, the sulfur vapor released from a sulfur powder located in the low-temperature zone of the CVD furnace then sulfurized the metal or metal oxide. The evaporation rate and amount of the heated sulfur powder tends to be uncontrollable because the saturation vapor pressure of the sulfur is exponentially dependent on the temperature inside the furnace. The resultant sulfurized film includes a mixture of monolayer, bilayer and multiple layers of TMDCs. In other words, the film formed from such traditional method is highly unreproducible with inconsistent quality, hence not suitable for commercial industrial applications.

To address this issue, an approach developed includes addition of hydrogen reduction gas in the growth process to induce the etching effect on the TMDCs. However, the etching effect tends to be highly unpredictable as excess concentration of hydrogen may hinder the growth of TMDC grains and reduce the surface coverage.

Recently, the metal-organic CVD (MOCVD) process was developed to provide a constant precursor supply (see FIG. 1A) and increase the scalability for the growth of TMDCs thin films. The liquid precursors with high equilibrium vapor pressure used in MOCVD allow more reliable control in terms of their flow rate and dose with bubblers and mass flow controllers. However, the growth of monolayer $WS_2$ and $MoS_2$ films takes an undesirable long growth time (more than a day for monolayer growth) and the grain size of $WS_2$ films is small (less than several tens of nm) with random orientation. The misalignment of grain orientation in the TMDC thin film degrades the physical properties (e.g. lower electrical mobility).

The unacceptably long growth time is not economically desirable for manufacturing of monolayer TMDCs at an industrial scale. Also, MOCVD is not a self-limiting process like other reported growth methods such as CVD/MBE/PVD (MBE and PVD denotes molecular beam epitaxy and physical vapor deposition, respectively), that is to say, the second layer nucleation and/or growth occurs after substantial growth of a first layer domains or their coalescence. This poses a serious challenge for the growth of large-area monolayer TMDCs that is desirable for their reliable and robust applications in nanoelectronic devices. The presence of 2nd layer domains may cause the variation in the properties of TMDCs, i.e. due to difference in electronic structure between bilayer and monolayer TMDCs, giving rise to variation in device parameters and affecting circuit yields.

There is thus a need to provide for a solution that addresses one or more of the limitations mentioned above. The solution should at least provide for a method of forming a TMDC monolayer.

SUMMARY

In a first aspect, there is provided for a method of forming a transition metal dichalcogenide monolayer, the method includes:
  depositing a transition metal, a transition metal oxide, or a mixture thereof, on a substrate;
  introducing a chalcogen precursor to the transition metal, the transition metal oxide, or the mixture thereof, in the presence of an etching gas and a carrier gas at a first temperature, to form a transition metal dichalcogenide on the substrate from the transition metal, the transition metal oxide, or the mixture thereof; and
  subliming the transition metal dichalcogenide on the substrate in the presence of a pulsating supply of a vapor of the chalcogen precursor to form the transition metal dichalcogenide monolayer at a second temperature, wherein the vapor of the chalcogen precursor includes a chalcogen vapor.

BRIEF DESCRIPTION OF THE DRAWINGS

The drawings are not necessarily to scale, emphasis instead generally being placed upon illustrating the principles of the present disclosure. In the following description, various embodiments of the present disclosure are described with reference to the following drawings, in which:

FIG. 1 depicts the constant flow of sulfur used in the growth of metal-organic traditional CVD-$WS_2$.

FIG. 2A depicts the annealing profile of tungsten, oxide of tungsten (i.e. $WO_x$), or a mixture thereof, on coated substrates. 4 denotes for the critical temperature where the TMDC top layer is removed by being sublimated or thermally etched, leaving behind a monolayer of the TMDC. The sublimation or etching (thermal stripping) continues to occur above this critical temperature (e.g. 900° C. or more)

FIG. 2B illustrates a sequential control of sulfur pulse along the growth process of $WS_2$ demonstrated by the present method. 5 denotes the pulsed control of the chalcogen (e.g. sulfur) throughout the process of growing the TMDC on the substrate.

FIG. 5A shows a plane view of an atomic force microscopic (AFM) image of 1 $\mu m^2$ of the $WS_2$ monolayer.

FIG. 6A is a schematic drawing of the substrate coated with a mixture of metal and an oxide of the metal before sulfurization step of the present method. Top image shows a side view and bottom image shows a top-down view.

FIG. 6B is a schematic drawing of the substrate coated with the monolayer TMDC after sulfurization step of the present method.

DETAILED DESCRIPTION

Figure 1A:
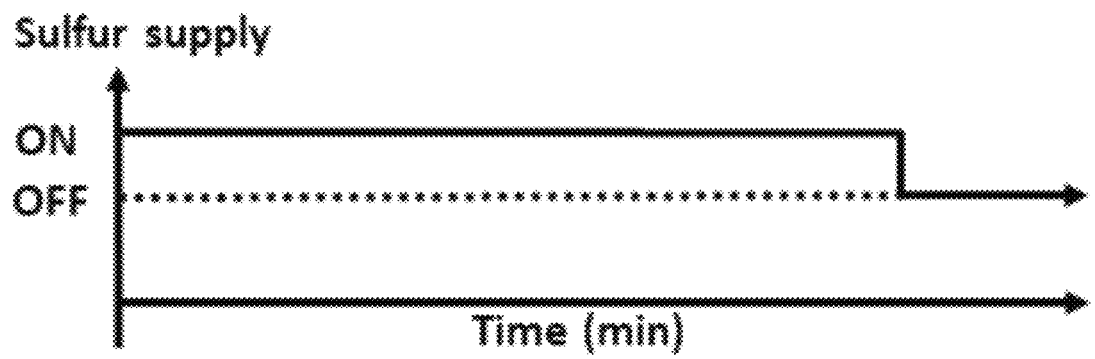
FIG. 1A is a plot of sulfur supply against time in minutes (min).
Figure 1B:
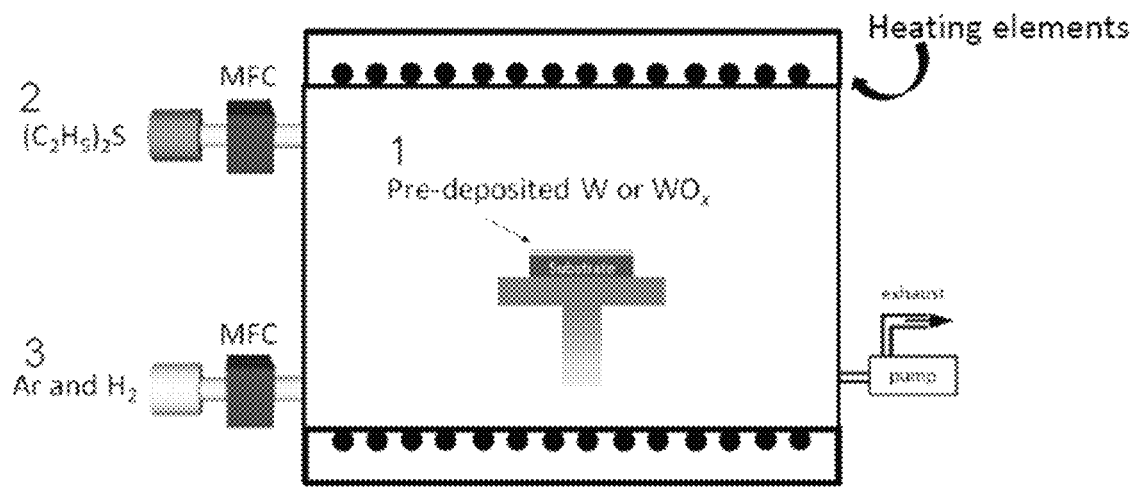
FIG. 1B illustrates a non-limiting example of the chamber (e.g. furnace) used in the present method to demonstrate the self-limiting growth of ultra-smooth monolayer transition metal dichalcogenide (TMDC). The TMDC monolayer formed has grains of aligned orientation. The method involves sulfurization and then sublimation. 1 denotes for a substrate having a portion of a surface pre-deposited with a transition metal, an oxide of the transition metal, or a mixture thereof (e.g. W or $WO_x$ for $WS_2$ growth). The abbreviation of $WO_x$ denotes for oxide of tungsten, which may include and not limited to, tungsten (III) oxide, tungsten (IV) oxide, tungsten (VI) oxide, tungsten pentoxide. 2 denotes for the chalcogen precursor used in its liquid form, e.g. ethyl disulfide $(C_2H_5)_2S$. 3 denotes for the gases (e.g. argon, Ar, and hydrogen, $H_2$) used. MFC denotes for mass flow controller.

The following detailed description refers to the accompanying drawings that show, by way of illustration, specific details and embodiments in which the present disclosure may be practiced.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The present disclosure relates to a method of forming a transition metal dichalcogenide monolayer. The term "monolayer" herein refers to a layer formed of a single plane of molecules or grains of the transition metal dichalcogenide. In other words, the monolayer is absent of vertical stacking of transition metal dichalcogenides molecules or transition metal dichalcogenide grains. A transition metal dichalcogenide (TMDC) monolayer may include, for example, atomically thin semiconductors of the type $MX_2$, wherein M denotes a transition metal atom (Mo, W, etc.) and X denotes a chalcogen atom (S, Se, or Te), wherein in a monolayer, the M atoms form a single plane that is sandwiched between two planes of X atoms through strong chemical bonds between neighbouring M and X atoms without having any vertical stacking of additional planes and/or layers of M or X atoms.

The present method involves providing a substrate having a transition metal, an oxide thereof, or a mixture thereof, deposited thereon. The "oxide thereof" is termed herein with the expression "oxide of the transition metal" and "transition metal oxide" for brevity.

In the present method, the transition metal, transition metal oxide, or mixture thereof, reacts with a chalcogen vapor to form a transition metal dichalcogenide. Typically, traditional methods of introducing chalcogen vapor to the transition metal, transition metal oxide, or mixture thereof, is either a constant supply or suffers from uncontrollable vapor pressure. Such traditional methods lead to formation of transition metal dichalcogenide that is susceptible to overgrowth (and/or uncontrollable growth) and hence form a film having multiple layers of transition metal dichalcogenide. The overgrowth renders random orientation of the transition metal dichalcogenide molecules or crystal grains in the film, which compromises various properties of the transition metal dichalcogenides. For example, a second monolayer of transition metal dichalcogenide may form on the first monolayer of transition metal dichalcogenide. The second monolayer may not be stacked on the first monolayer in an orderly manner. As more layers built on or nucleation growth sets in, certain regions of the transition metal dichalcogenide formed on the substrate may be thicker or misaligned in growth orientation. Such disordered structure may, for example compromise electrical mobility as grains are not aligned in orientation and hinders electron transport.

In fact, in traditional methods, formation of multiple layers of transition metal dichalcogenide tends to be inevitable. Advantageously, the present method is able to address this. The present method involves subliming and providing a pulsating supply of the chalcogen precursor vapor and hence the chalcogen vapor. The term "subliming" herein refers to subjecting a chemical to sublimation, wherein the chemical converts from a solid state (i.e. solid phase) directly to a gaseous state (i.e. gaseous phase) without converting into a liquid and without a change in temperature during the change of solid phase to vapor phase. The sublimation advantageously removes multiple layers of the transition metal dichalcogenides or their overgrowth on a substrate but retains a monolayer of the transition metal dichalcogenide on the substrate. The monolayer is retained as the sublimation does not provide a force sufficient to overcome the interaction between the bottom-most monolayer and the substrate (i.e. strong interface coupling). Said differently, layers of the transition metal dichalcogenide are more thermodynamically unstable compared to the bottom-most layer adjacent to the substrate surface. For such removal by sublimation in the present method, a high temperature is used. The high temperature is sufficient to remove multiple layers of transition metal dichalcogenide on the substrate but yet retain a monolayer thereon.

Also, the present method involves providing a pulsating supply of chalcogen precursor vapor (e.g. ethyl disulfide vapor) and hence a pulsating supply of chalcogen vapor (e.g. sulfur vapor). The chalcogen vapor may arise from heating the chalcogen precursor to a certain temperature (e.g. boiling point of the chalcogen precursor). In other words, the chalcogen precursor vapor may contain the chalcogen vapor. A carrier gas (e.g. argon) may be used to transport the chalcogen to the transition metal dichalcogenide on the substrate. A pulsating supply (see FIG. 2B) herein refers to chalcogen precursor vapor and/or chalcogen vapor that is originally supplied at one flow rate or amount, and during the sublimation, the original supply (e.g. flowrate or amount) may be reduced for a duration. After that, the supply (e.g. flowrate or amount) may be increased for a duration. The reduction and increase of supply is then repeated for one or more cycles. The increase in supply may be to restore the original supply. With such pulsating supply of chalcogen precursor vapor and/or chalcogen vapor, the amount of chalcogen precursor vapor and hence chalcogen vapor are controlled such that excess chalcogen (e.g. sulfur) can be minimized, thereby preventing overgrowth, and even uncontrolled growth. The term "pulsating supply" and "pulsed supply" herein are used interchangeably.

The present method may involve an etching gas to aid the removal of layers of transition metal dichalcogenide that are formed on top of the bottom-most monolayer. The etching gas may be provided with the carrier gas under a continuous flow. Together with the pulsating supply of chalcogen precursor vapor and/or chalcogen vapour, a uniform monolayer can be better formed across the entire surface of the substrate.

Advantageously, through the present method, it is not necessary to use solid-state chalcogen precursor, so as to afford a more controllable growth. The monolayer of transition metal dichalcogenide formed has a high surface coverage film without overgrowth.

Details of various embodiments of the method of the first aspect and advantages associated with the various embodiments are now described below.

In the present disclosure, there is provided a method of forming a transition metal dichalcogenide monolayer.

The method includes depositing a transition metal, a transition metal oxide, or a mixture thereof, on a substrate. As one non-limiting example, a transition metal and a transition metal oxide may be deposited on the substrate.

The method includes introducing a chalcogen precursor to the transition metal, the transition metal oxide, or the mixture thereof, in the presence of an etching gas and a carrier gas at a first temperature, to form a transition metal dichalcogenide on the substrate from the transition metal, the transition metal oxide, or the mixture thereof. In various embodiments, introducing the chalcogen precursor may be or may include introducing the chalcogen precursor as a vapor (i.e. introducing the chalcogen precursor in a gaseous form).

The method includes subliming the transition metal dichalcogenide on the substrate in the presence of a pulsating supply of a vapor of the chalcogen precursor to form the transition metal dichalcogenide monolayer at a second temperature, wherein the vapor of the chalcogen precursor includes a chalcogen vapor. The expressions "vapor of a chalcogen precursor" and "vapor of the chalcogen precursor" may be interchangeably herein referred to as a chalcogen precursor vapor for brevity.

In various embodiments, the substrate may include or may be silicon oxide or sapphire. Sapphire is also herein referred to as α-aluminum oxide.

In various embodiments, the transition metal may include or may be molybdenum or tungsten. A mixture of transition metals may be used. For example, the transition metal may include both molybdenum and tungsten. The present method is compatible with various transition metals.

In various embodiments, the transition metal oxide may include or may be molybdenum oxide or tungsten oxide. The transition metal oxide may be doped with another metal, such as a transition metal. Such doped transition metal oxide is referred herein as "binary transition metal oxide" or simply "binary oxide". In certain embodiments, the transition metal oxide may include or may have two transition metals.

Depositing the transition metal, the transition metal oxide, or a mixture thereof, may include depositing the transition metal, the transition metal oxide, or a mixture thereof, on at least a portion of a surface of the substrate. In other words, the transition metal, the transition metal oxide, or a mixture thereof, may be deposited on one part of the surface, some parts of the surface, or on an entire surface, of the substrate. In instances where only one or some parts are deposited, the transition metal dichalcogenides sublimed from the top layers (i.e. layers above the bottom-most monolayer on the substrate) can be transported or migrate to any bare surface of the substrate to be re-deposited thereon, forming a continuous monolayer of the transition metal dichalcogenide across the entire surface. Advantageously, the present method does not require the transition metal, the transition metal oxide, or a mixture thereof, to be deposited on the entire surface of the substate, and yet the transition metal dichalcogenide monolayer can still be formed on an entire surface of the substrate which the transition metal, transition metal oxide, or the mixture thereof was deposited on.

Introducing the chalcogen precursor to the transition metal, the transition metal oxide, or a mixture thereof, may include introducing the chalcogen precursor as a liquid, and heating the chalcogen precursor to an evaporation temperature to have the chalcogen precursor in a gaseous form. The evaporation temperature may range from room temperature (e.g. 25° C.) to the boiling temperature of the liquid chalcogen precursor. In other words, in various embodiments, introducing the chalcogen precursor to the transition metal, the transition metal oxide, or the mixture thereof, may include heating the chalcogen precursor to have the chalcogen precursor in a gaseous form. The transition metal, transition metal oxide, or a mixture thereof, may be placed in a reaction chamber prior to introducing the chalcogen precursor. The liquid chalcogen precursor may be placed in another precursor chamber (e.g. a container or empoule) that is in fluid communication with the reaction chamber and a carrier gas source. The evaporated gaseous chalcogen precursor may then be directed (i.e. flowed) into the reaction chamber using the carried gas. A liquid chalcogen precursor advantageously circumvents the unstable equilibrium vapor pressure arising from chalcogen precursor vapor formed from a solid chalcogen precursor. In the reaction chamber, the transition metal, the transition metal oxide, or a mixture thereof may be chalcogenized (e.g. sulfurized) into a transition metal dichalcogenide at the first temperature in a range of 600° C. to 900° C., but it is to be noted that sublimation of the transition metal dichalcogenide herein potentially occurs at a temperature of 900° C. or more, e.g. 900° C. to 1050° C. In various embodiments, the first temperature may be in a range of 600° C. to less than 900° C., 700° C. to less than 900° C., 800° C. to less than 900° C., less than 900° C., etc. In certain instances, the first temperature may be 600° C. or less than 900° C. Heating the chalcogen precursor (e.g. ethyl disulfide) to the first temperature may generate the chalcogen vapor (e.g. sulfur). Said differently, the chalcogen precursor vapor may contain the chalcogen vapor. As a non-limiting example, the chalcogen precursor may be a highly volatile organic sulfur compound with a very low boiling point, which tends to evaporate and form a chalcogen vapor at a low temperature (e.g. boiling point of the chalcogen precursor). For example, the chalcogen precursor may be or may include ethyl disulfide as the highly volatile organic sulfur compound with a very low boiling point, which may start to evaporate to give rise to sulfur vapor at a low temperature of 110° C. (boiling point of ethyl disulfide).

In various embodiments, the chalcogen precursor includes ethyl disulfide, ethyl diselenide, ethyl telluride, ammonium sulfide, ammonium selenide, ammonium telluride, hydrogen sulfide, hydrogen selenide, or hydrogen telluride. In various embodiments, the chalcogen vapor may be or may include sulfur, selenium, or tellurium.

Introducing the chalcogen precursor to the transition metal, the transition metal oxide, or the mixture thereof, may include introducing the chalcogen precursor to the transition metal, the transition metal oxide, or the mixture thereof, in the presence of the etching gas and the carrier gas. In various embodiments, the etching gas may include or may be hydrogen.

In various embodiments, the carrier gas may be or may include argon, helium, or nitrogen. In various embodiments, the carrier gas and the etching gas may be present in a volume ratio in a range of 60:40 to 95:5, 60:40 to 85:15, 85:15 to 95:5, etc. In certain non-limiting examples, the volume ratio of the carrier gas to etching gas may be 85:15.

Subliming the transition metal dichalcogenide on the substrate in the presence of the pulsating supply of the chalcogen precursor vapor may include heating the transition metal dichalcogenide on the substrate to the second temperature which is higher than the first temperature so as to form the transition metal dichalcogenide monolayer. The second temperature may be 900° C. or more, 1000° C. or more, 1100° C. or more, 1200° C. or more, etc. In certain instances, the second temperature may be 1000° C. or in a range of 900° C. to 1050° C.

Subliming the transition metal dichalcogenide on the substrate in the presence of the pulsating supply of the chalcogen precursor vapor may include etching the transition metal dichalcogenide with the etching gas to form the transition metal dichalcogenide monolayer.

Subliming the transition metal dichalcogenide on the substrate in the presence of the pulsating supply of the chalcogen precursor vapor may include (i) reducing the supply of the chalcogen precursor vapor, (ii) maintaining the reduced supply of the chalcogen precursor vapor, (iii) increasing the supply of the chalcogen precursor vapor from the reduced supply of the chalcogen precursor vapor, (iv) maintaining the increased supply of the chalcogen precursor vapor, and repeating steps (i) to (iv) to form the transition metal dichalcogenide monolayer. A non-limiting example of the present pulsating supply is illustrated in FIG. 2B.

In various embodiments, increasing the supply of the chalcogen precursor vapor from the reduced supply of the chalcogen precursor vapor may be or may include restoring supply of the chalcogen precursor vapor. In other words, the original flow rate or amount is restored when increasing the supply from a reduced supply state (see FIG. 2B).

The word "substantially" does not exclude "completely" e.g. a composition which is "substantially free" from Y may be completely free from Y. Where necessary, the word "substantially" may be omitted from the definition of the present disclosure.

In the context of various embodiments, the articles "a", "an" and "the" as used with regard to a feature or element include a reference to one or more of the features or elements.

In the context of various embodiments, the symbol "~", terms "about" and "approximately" as applied to a numeric value encompasses the exact value and a reasonable variance, e.g. ±10%, ±5%, ±1%, ±0.5%, ±0.1%.

As used herein, the term "and/or" includes any and all combinations of one or more of the associated listed items.

Unless specified otherwise, the terms "comprising" and "comprise", and grammatical variants thereof, are intended to represent "open" or "inclusive" language such that they include recited elements but also permit inclusion of additional, unrecited elements.

EXAMPLES

The present disclosure relates to a method of forming a transition metal dichalcogenide monolayer on a substrate. The present method involves pre-deposition of an uniform and appropriate thickness (0.5 nm to 4 nm) of metal, metal oxide, or a mixture thereof, on the substrate, i.e. need not be completely but can be partially covering the substrate surface, which enables the uniform growth of the final product, i.e. a monolayer TMDC film fully covering the growth wafer, after sulfurization and subsequent sublimation process.

The formation of the TMDC monolayer may occur in an environment filled with argon and/or hydrogen (Ar/H$_2$) gases, wherein the Ar acts as a carrier gas and H$_2$ acts as a reduction and/or etching gas The present method decouples the various steps, which allows for control of two processes in the growth cycle of the monolayer TMDC (e.g. WS$_2$). For example, in the step of thermal vapor sulfurization of the metal/metal oxide on the substrate which can occur at low processing temperature (e.g. lower than 900° C.), and thermal stripping-off/sublimation of a TMDC top layer (e.g. WS$_2$) from the substrate at high processing temperature (e.g. 900° C. or more). The temperature of the latter step is termed herein the "critical temperature", which is required to overcome the $MX_2$-$MX_2$ interlayer coupling (e.g. $WS_2$-$WS_2$ interlayer coupling) and $MX_2$-substrate interaction (e.g. $WS_2$-substrate interaction). Also, deposition of $MX_2$ (e.g. $WS_2$) can take place on any bare surface of the substrate. X denotes for the chalcogen.

The thermal stripping-off/sublimation and deposition of $WS_2$ can be controlled by a pulsed supply of sulfur, which includes several on-off repeated pulsing sequences.

The liquid precursor source (e.g. ethyl disulfide $(C_2H_5)_2S$) with high equilibrium vapor pressure or gas precursor with stable saturation vapor pressure is usable as the sulfur supply.

The pulse duration and pulse sequence of the sulfur supply can be controlled and regulated with a bubbler/ampule and mass flow controller in the present method. The present method may involve a CVD process.

The present method is described in further details, by way of non-limiting examples, as set forth below.

Example 1: Non-Limiting Example of Present Method

A wafer-sized c-plane sapphire ($\alpha$-$Al_2O_3$) substrate was firstly deposited with a metal, oxide of a metal, or mixture thereof (e.g. tungsten, an oxide of tungsten, or mixture thereof) to form a nanoscale thin film (e.g. W/$WO_x$ film). The nanoscale thin film was about 0.5 nm to 4 nm thick. The abbreviation of $WO_x$ denotes for oxide of tungsten, which may include and not limited to, tungsten (III) oxide, tungsten (IV) oxide, tungsten (VI) oxide, tungsten pentoxide. The nanoscale thin film was then transferred into a furnace filled with a steady flow of 85 vol % Ar and 15 vol % $H_2$ gases. The other volume ratios mentioned hereinabove can be used.

Subsequent sulfurization was carried out at an appropriate temperature (e.g. 600° C.) with sulfur vapor releasing from a liquid precursor ethyl disulfide (i.e. $(C_2H_5)_2S$) with flow rate of 4 sccm is applied to form $WS_2$ (see FIGS. 2A and 2B). The sulfur vapor was diluted by the Ar carrier gas and the concentration of sulfur can be precisely regulated using a bubbler and mass flow controller. Apart from ethyl disulfide, other chalcogen precursor such as ethyl diselenide, ethyl telluride, ammonium sulfide, ammonium selenide, ammonium telluride, or hydrogen sulfide, hydrogen selenide, and/or hydrogen telluride, can be used. That is to say, other than sulfur vapor, selenium vapor and/or tellurium vapor may be used.

Next, thermal stripping-off (i.e, etching) or sublimation of $WS_2$ occurs at much increased processing temperature (e.g. 1000° C.) under a pulsed supply of $(C_2H_5)_2S$ vapor. A monolayer $WS_2$ film was specifically grown using this method, which turns out highly uniform and continuous over the wafer-sized areas, along with the deposition of $WS_2$ on the bare portion of the substrate. Said differently, the portion of the wafer containing the deposited metal, oxide of metal, or a mixture thereof, gets converted into the metal dichalcogenide (e.g. transition metal dichalcogenide) and the portion of the substrate not deposited with the metal, oxide of metal, or a mixture thereof, also has the metal dichalcogenide (e.g. transition metal dichalcogenide) formed thereon. The metal dichalcogenide (e.g. transition metal dichalcogenide) formed thereon is a monolayer, which is continuous. The monolayer of metal dichalcogenide (e.g. transition metal dichalcogenide) may be atomically thin or in range of up to several hundreds of nanometer.

The individual grains of the TMDC monolayer formed are highly orientated (i.e. aligned in orientation) across the $WS_2$ film with grain size up to several hundreds of nanometer. The advantages of this self-limiting growth approach include (1) high scalability (growth area is determined by the original W/$WO_x$ film coverage), (2) a wide process window (variation in W/$WO_x$ thickness is mitigated), (3) possibility for batch processing (several W/$WO_x$-deposited wafers can be processed simultaneously in same reactor, (4) potential for growing doped/alloyed W(M)$S_2$ monolayer by starting with W(M)$O_x$ binary oxide films, covering a portion of the substrate surface. This approach is also feasible and applicable to the growth of other TMDCs, (5) pre-deposition of W/$WO_x$ via the sputtering process is compatible with industry manufacturing equipment on wafer level, and (6) much shorter growth time for monolayer TMDC continuous layer (~1.2 hour) as compared to traditional MOCVD process (up to 26 hours).

Example 2: Characteristics of the TMDC Monolayer from the Present Method

The characteristics of the TMDC monolayer grown by the present method, using $WS_2$ as one of the various examples worked on, is described as follows.

Figure 3A:
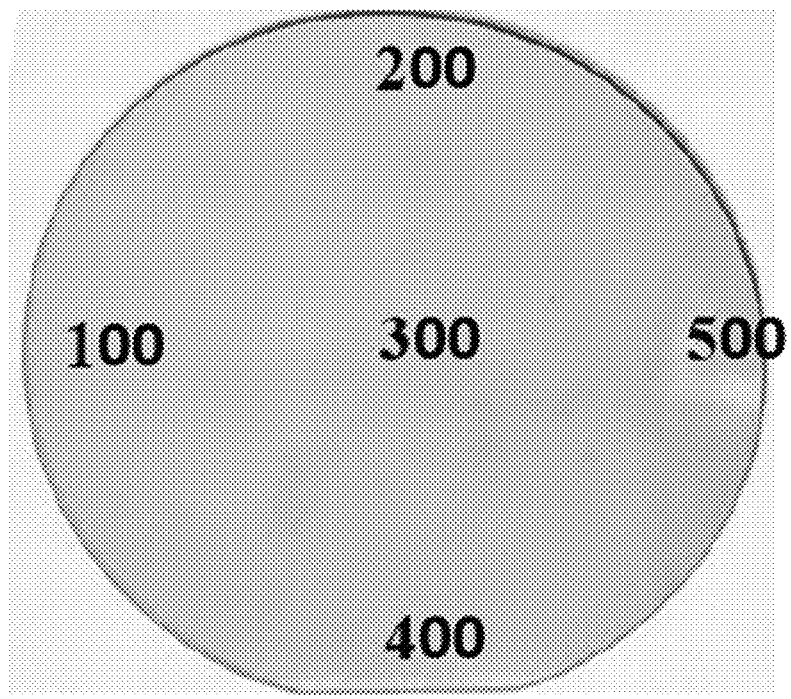
FIG. 3A shows a photograph of wafer-sized $WS_2$ grown on sapphire via the present method. The photoluminescence (PL) spectra measured from the wafer show characteristics unique to monolayer $WS_2$. The PL spectra for regions 100, 200, 300, 400 and 500 are shown in FIG. 3B, respectively. As can be seen, the monolayer $WS_2$ derived from the present method uniformly covers the entire sapphire substrate surface.
Figure 3B:
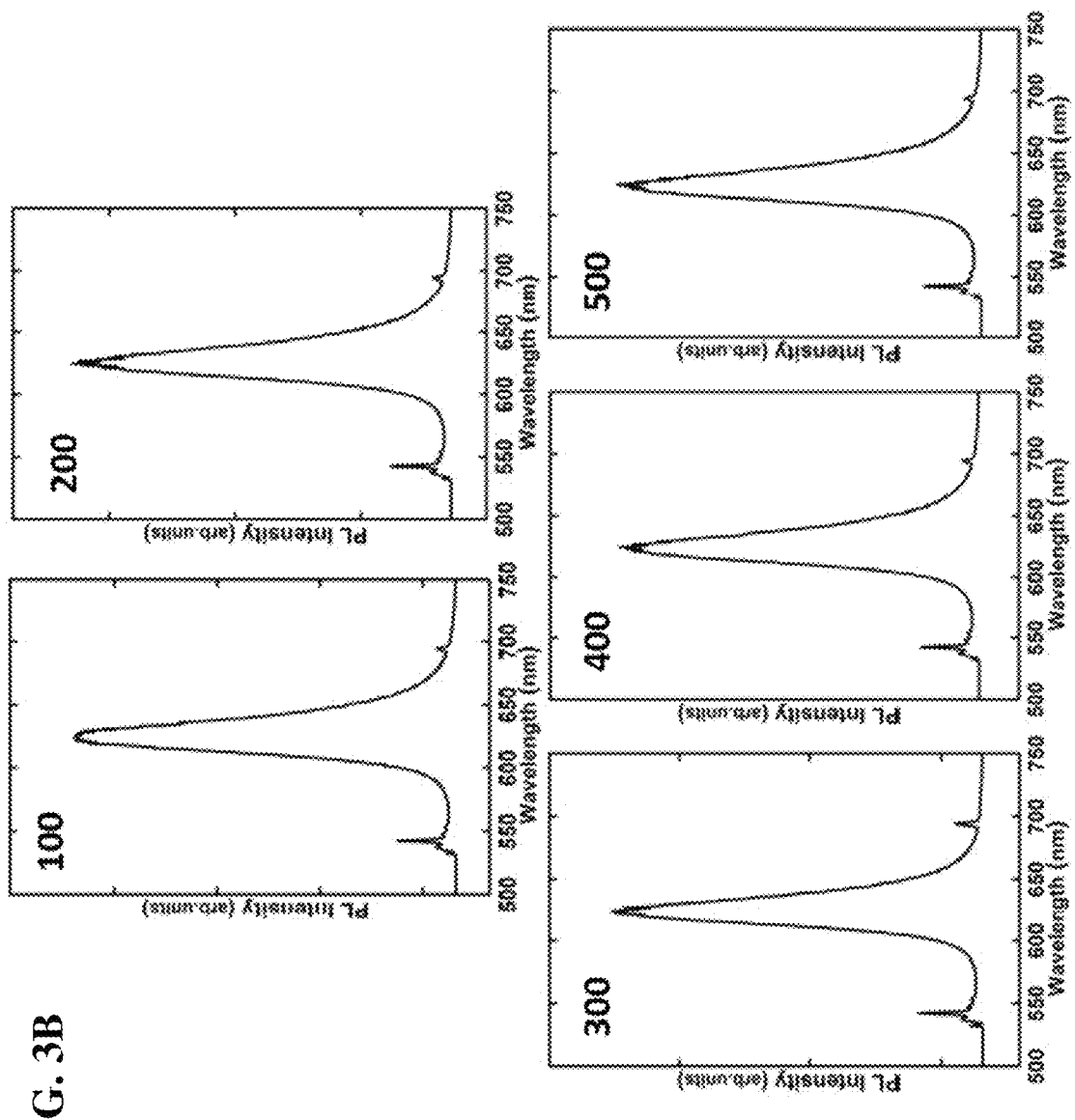
FIG. 3B shows the PL spectra detected from different regions (regions 100, 200, 300, 400 and 500) of the $WS_2$ film, wherein the intensity peak is uniformly located at wavelength of ~620 nm with strong emission.

Through the present method, specifically a monolayer $WS_2$ is grown on the wafer substrate (see FIG. 3A). The sharp photoluminescence (PL) peak at ~620 nm with high intensity corresponds to the direct band gap nature of monolayer $WS_2$ detectable from the full wafer.

Figure 4:
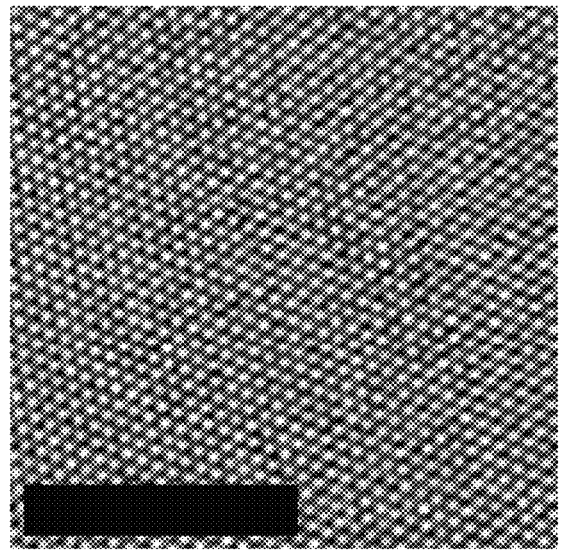
FIG. 4 is a high resolution transmission electron microscopy (TEM) image of monolayer $WS_2$. Scale bar in black denotes 5 nm.
Figure 5A:
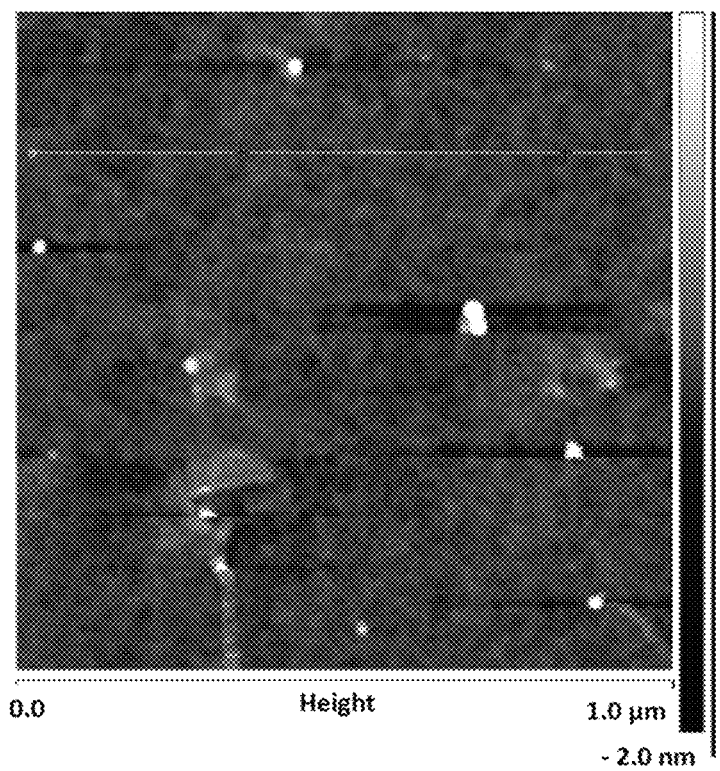
FIG. 5A shows the topographical and optical properties of monolayer $WS_2$ formed from the present method.
Figure 5B:
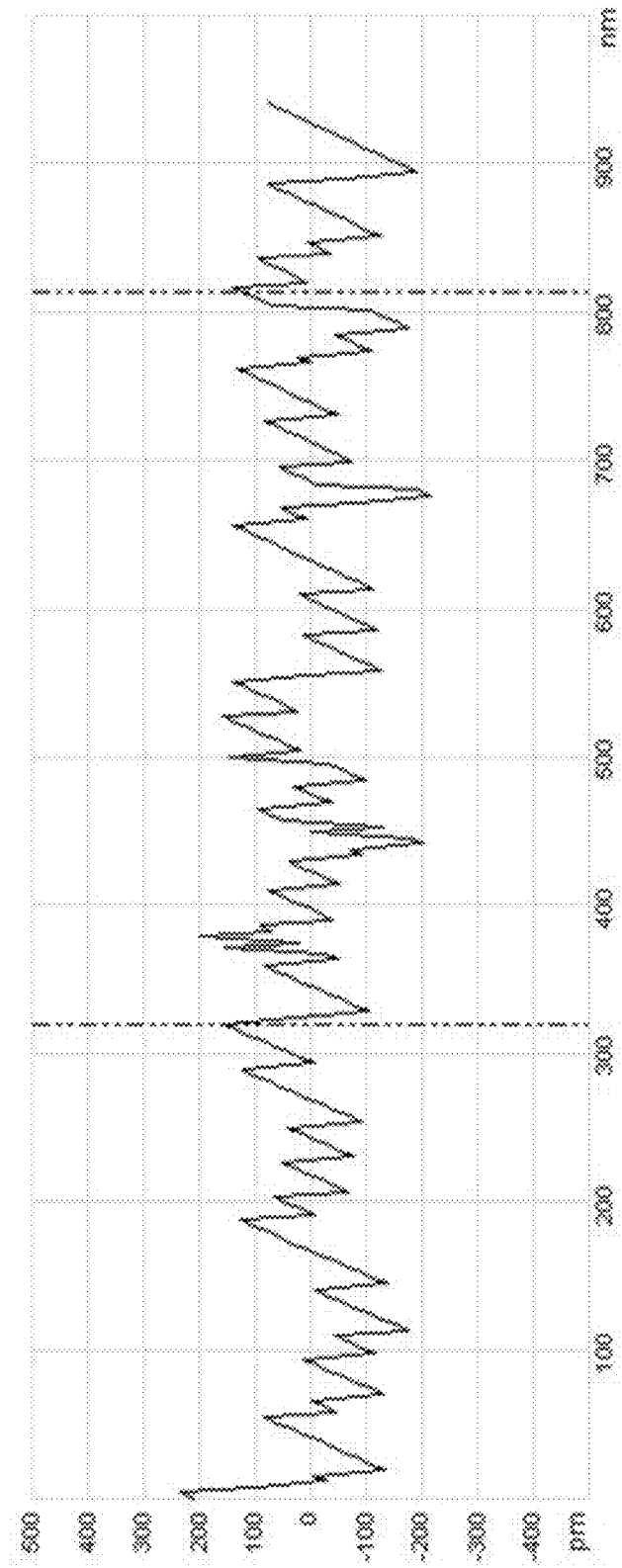
FIG. 5B shows a cross-sectional profile extracted along the white line from AFM image in FIG. 5A.
Figure 5C:
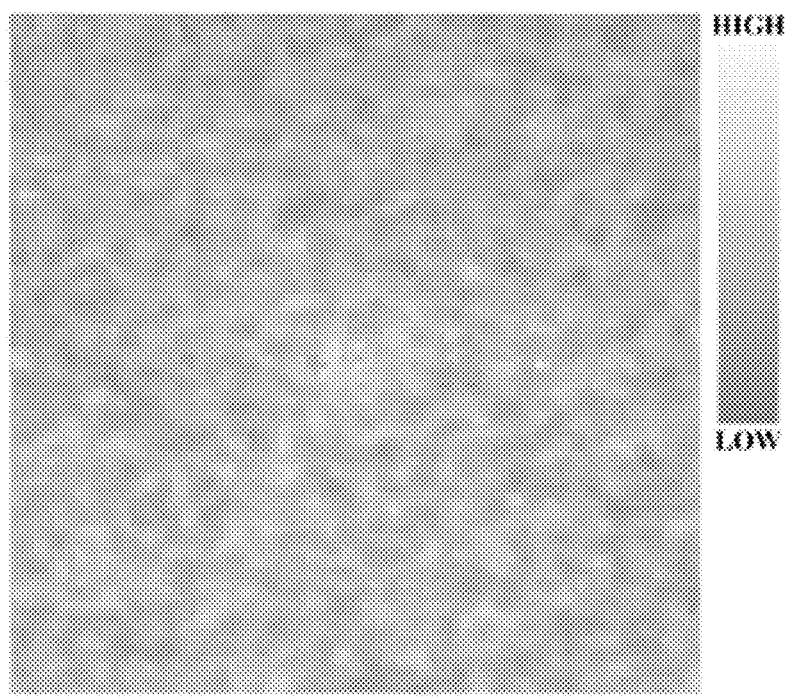
FIG. 5C shows the PL intensity mapping image in an area of 100×100 $\mu m^2$ $WS_2$ monolayer.
Figure 5D:
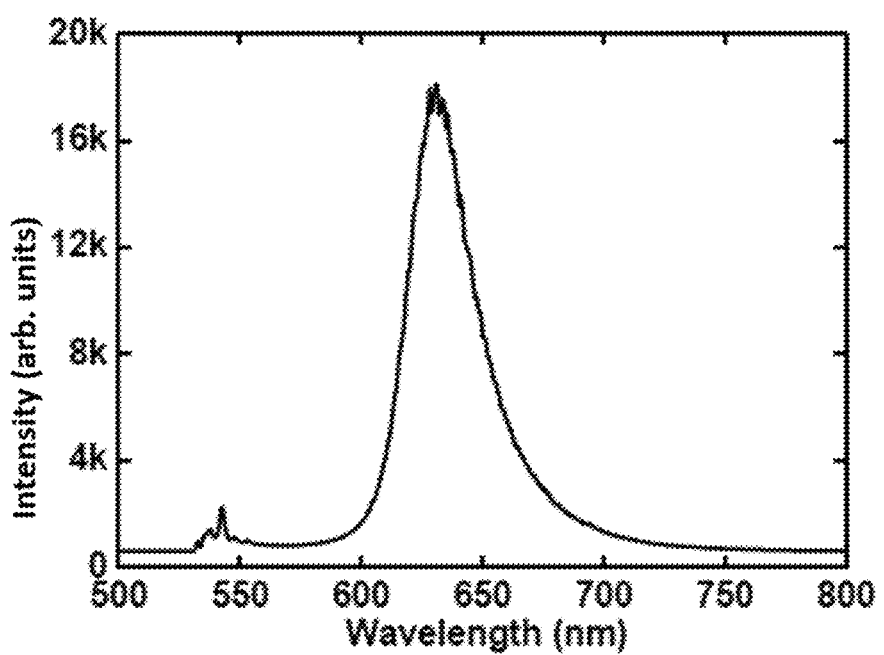
FIG. 5D shows a spectrum of PL emission measured from the $WS_2$ monolayer at room temperature.

The TMDC, using $WS_2$ as one of the examples, demonstrated highly orientated and crystalline grain growth in a reproducible manner as shown from the TEM image in FIG. 4.

As demonstrated by FIG. 5A to 5D, the $WS_2$ film obtained from the present method has an atomically smooth surface and has high PL emission intensity. The homogeneous color contrast observed from the PL intensity mapping image indicates that the basal plane of the $WS_2$ film is highly uniform, smooth and continuous.

Specifically a monolayer TMDC film with full surface coverage can be achieved over the entire substrate even when the initial metal, metal oxide and/or mixture thereof are deposited on a portion of the substrate surface. This is because the present method provides for re-deposition of sublimed TMDC (e.g. $WS_2$) on the bare portion of the substrate as depicted in FIGS. 6A and 6B.

Figure 7A:
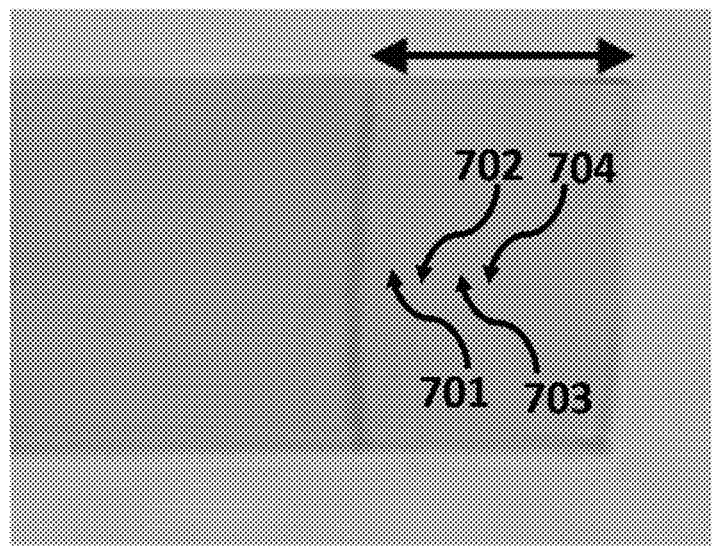
FIG. 7A is a photograph of $WS_2$ grown on sapphire. The bare portion of the substrate surface deposited with $WS_2$ is indicated. The $WS_2$ deposited on the bare portion of the substrate (as indicated by the double-headed arrow, i.e. deposition region of sublimed $WS_2$) had sublimed from the top layer of $WS_2$ formed from the metal/metal oxide. Spots 701, 702, 703, 704 are used for establishing Raman spectra result as shown in FIG. 7B.
Figure 7B:
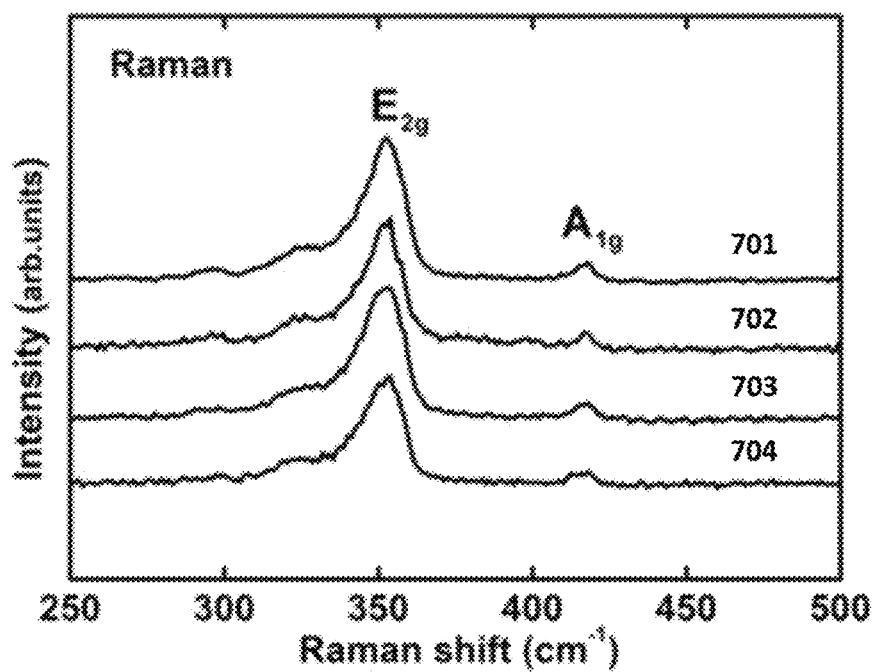
FIG. 7B shows a Raman spectra measured at different spots (spots 701, 702, 703, 704) of the re-deposition region of $WS_2$ show characteristics unique to a $WS_2$ monolayer. The re-deposition of $WS_2$ is from the top layer of $WS_2$ that was converted from the metal/metal oxide and sublimed, which then deposit (i.e. and hence the term re-deposit) on the bare surface of the substrate not coated with the metal/metal oxide.

The thickness of re-deposited $WS_2$ is a monolayer as demonstrated from the high Raman mode ratio of $E_{2g}/A_{1g}$ peaks (see FIGS. 7A and 7B).

Example 3: Summary and Applications

The present method is a self-limiting growth method for specifically a monolayer TMDC. Unlike conventional growth methods, the present transition metal dichalcogenide film formed from the present method can involve CVD sulfurization first and followed by sublimation of TMDCs from the substrate at a critical temperature that renders the thermodynamic instability of the overgrowth regions and leave behind only a monolayer of the TMDC on the substrate.

The present method utilizes the pulsed chalcogen (e.g. sulfur) vapor supply in the CVD growth process of TMDCs. Conversely, traditional way of supplying chalcogen vapor suffers from uncontrollable chalcogen vapor pressure where solid-phase powder in CVD is used and due to uninterrupted flow of chalcogen supply in MOCVD process. The chalcogen may be sulfur. As compared to such traditional ways of supplying the chalcogen vapor, the present step of pulsed supply provides a chalcogen environment to specifically form only a TMDC monolayer.

The present method has high scalability (apart from wafer-sized growth), has a wide process window (allows for more margin variation in W/WO$_x$ thickness). The present method is possible for batch processing (several W/WO$_x$-deposited wafers can be processed simultaneously in same reactor. The present method is potentially usable for growing doped/alloyed W(M)S$_2$ monolayer by starting with W(M)O$_x$ binary oxide films. This approach should be applicable to other TMDCs as well.

The present method involves pre-deposition of W/WO$_x$ via the sputtering process, which is compatible with industry manufacturing equipments at wafer level.

Advantageously, the present method requires significantly less time to form or grow a TMDC continuous monolayer layer (~1.2 hour) as compared to traditional MOCVD process (up to 26 hours).

The monolayer TMDC formed from the present method offers a direct band gap, rendering it suitable for use in optoelectronics. The present monolayer TMDC is also applicably usable in wireless chip-to-chip communication, photonics, medical imaging, food and beverage inspection, 3D imaging, artificial or virtual reality applications, gas sensing and imaging, night and/or fog vision, medical security and process control.

While the present disclosure has been particularly shown and described with reference to specific embodiments, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

The invention claimed is:

1. A method of forming a transition metal dichalcogenide monolayer, the method comprising:
   depositing a transition metal, a transition metal oxide, or a mixture thereof, on a substrate;
   introducing a chalcogen precursor to the transition metal, the transition metal oxide, or the mixture thereof, in the presence of an etching gas and a carrier gas at a first temperature, to form a transition metal dichalcogenide on the substrate from the transition metal, the transition metal oxide, or the mixture thereof; and
   subliming the transition metal dichalcogenide on the substrate in the presence of a pulsating supply of a vapor of the chalcogen precursor to form the transition metal dichalcogenide monolayer at a second temperature, wherein the vapor of the chalcogen precursor comprises a chalcogen vapor.

2. The method of claim 1, wherein the substrate comprises silicon oxide or sapphire.

3. The method of claim 1, wherein the transition metal comprises molybdenum or tungsten.

4. The method of claim 1, wherein the transition metal oxide comprises molybdenum oxide or tungsten oxide.

5. The method of claim 1, wherein depositing the transition metal, the transition metal oxide, or the mixture thereof, comprises:
   depositing the transition metal, the transition metal oxide, or the mixture thereof, on at least a portion of a surface of the substrate.

6. The method of claim 1, wherein introducing the chalcogen precursor to the transition metal, the transition metal oxide, or the mixture thereof, comprises:
   heating the chalcogen precursor to have the chalcogen precursor in a gaseous form.

7. The method of claim 1, wherein the first temperature is in a range of 600° C. to less than 900° C.

8. The method of claim 1, wherein the chalcogen precursor comprises ethyl disulfide diethyl sulfide, ethyl diselenide, ethyl telluride, ammonium sulfide, ammonium selenide, ammonium telluride, hydrogen sulfide, hydrogen selenide, or hydrogen telluride.

9. The method of claim 1, wherein the chalcogen vapor comprises sulfur, selenium, or tellurium.

10. The method of claim 1, wherein the etching gas comprises hydrogen.

11. The method of claim 1, wherein the carrier gas comprises argon, helium, or nitrogen.

12. The method of claim 1, wherein the carrier gas and the etching gas are present in a volume ratio in a range of 60:40 to 95:5.

13. The method of claim 1, wherein subliming the transition metal dichalcogenide on the substrate in the presence of the pulsating supply of the vapor of the chalcogen precursor comprises:
   heating the transition metal dichalcogenide on the substrate to the second temperature which is higher than the first temperature so as to form the transition metal dichalcogenide monolayer.

14. The method of claim 1, wherein the second temperature is 900° C. or more.

15. The method of claim 1, wherein subliming the transition metal dichalcogenide on the substrate in the presence of the pulsating supply of the vapor of the chalcogen precursor comprises:
   etching the transition metal dichalcogenide with the etching gas to form the transition metal dichalcogenide monolayer.

16. The method of claim 1, wherein subliming the transition metal dichalcogenide on the substrate in the presence of the pulsating supply of the vapor of the chalcogen precursor comprises:
   (i) reducing the supply of the vapor of the chalcogen precursor;
   (ii) maintaining the reduced supply of the vapor of the chalcogen precursor;
   (iii) increasing the supply of the vapor of the chalcogen precursor from the reduced supply of the vapor of the chalcogen precursor;
   (iv) maintaining the increased supply of the vapor of the chalcogen precursor; and
   repeating steps (i) to (iv) to form the transition metal dichalcogenide monolayer.

17. The method of claim 16, wherein increasing the supply of the vapor of the chalcogen precursor from the reduced supply of the vapor of the chalcogen precursor comprises:
   restoring supply of the vapor of the chalcogen precursor.

18. The method of claim 1, wherein the transition metal oxide comprises two transition metals.

* * * * *